United States Patent [19]

Cripe et al.

[11] Patent Number: 5,381,109
[45] Date of Patent: Jan. 10, 1995

[54] PULSE STEP MODULATOR HAVING FAULTED MODULE DETECTION AND COMPENSATION

[75] Inventors: David W. Cripe; William S. Schlegl, both of Quincy, Ill.

[73] Assignee: Harris Corporation, Melbourne, Fla.

[21] Appl. No.: 226,778

[22] Filed: Apr. 12, 1994

[51] Int. Cl.6 .............................................. H03F 3/38
[52] U.S. Cl. ...................................... 330/10; 330/149; 332/107; 332/160; 455/108
[58] Field of Search ..................... 330/10, 149, 207 A, 330/251; 332/107, 115, 159, 160, 181; 455/108

[56] References Cited

U.S. PATENT DOCUMENTS

| | | | |
|---|---|---|---|
| 4,403,197 | 9/1983 | Swanson | 330/10 |
| 4,560,944 | 12/1985 | Furrer | 330/10 |
| 4,745,368 | 5/1988 | Lodahl | 330/10 |

*Primary Examiner*—James B. Mullins
*Attorney, Agent, or Firm*—Tarolli, Sundheim & Covell

[57] ABSTRACT

A pulse step modulator (PSM) is presented herein for use in an AM transmitter. The modulator includes a plurality of unit step modules connected together in series with each module including a DC voltage source together with an associated actuatable switch for, when actuated, turning on the associated module to provide a unit step voltage. An output circuit is connected to the series connected modules for providing an output voltage to a load wherein the magnitude of the output voltage is equal to the sum of all of the voltage sources of the modules that are turned on. A plurality of module turn on signals are provided with each turn on signal serving to actuate one of the switches in one of the modules with the number of turn on signals being provided being dependent upon the magnitude of an input signal. A fault detector monitors the operation of the modules for fault conditions and provides for each module a first signal representing that the module has faulted in an on condition or a second signal representative that the module has faulted in an off condition. Circuitry is provided for varying the number of turn on signals dependent upon the fault conditions detected by the fault detector to compensate for any faulted modules.

20 Claims, 4 Drawing Sheets

PULSE STEP MODULATOR HAVING FAULTED MODULE DETECTION AND COMPENSATION

FIELD OF THE INVENTION

This invention relates to the art of modulators and, more particularly, to pulse step modulators which are particularly applicable for use in AM radio broadcasting systems.

DESCRIPTION OF THE PRIOR ART

In AM radio broadcasting in the medium-wave and short-wave bands, a high-power vacuum tube is conventionally used in the final radio frequency amplifier stage of the transmitter. For maximum power-amplification efficiency, this tube is not operated as a linear amplifier, but rather as a class C or class D biased circuit, producing an RF envelope which follows that of the B+ DC supply voltage provided to the tube anode. Thus, modulation of the RF signal is achieved through varying the B+ DC supply to the plate anode of the tube. The high-powered audio amplification circuitry required to vary this voltage is referred to in the art as the modulator.

Recently, a modulator to achieve the foregoing has been employed in the art and is known as a pulse step modulator (PSM). Such a pulse step modulator is disclosed in U.S. Pat. No. 4,403,197 to H. I. Swanson. Briefly, a pulse step modulator (PSM) as disclosed in that patent includes a plurality of series connected unit step modules each of which includes an isolated DC voltage source, a remotely controlled switch and a series diode. The switch in each module may be remotely controlled to turn the module on or off. As each module is turned on, it provides a step voltage. As the various modules are turned on in a stepwise fashion, the output voltage will increase in steps from 0 volts to a maximum voltage with the maximum equalling the sum of all of the module DC voltage sources. A lowpass filter at the output may be employed for removing switching noise. An encoder or the like monitors a time varying input signal, such as an audio signal, and turns on one of the unit step modules for each incremental increase in the value of the audio signal. As the audio signal continues to increase in value, the modules are turned on one at a time in a given order. Similarly, as the audio signal decreases in value, the modules are sequentially turned off in the reverse order.

The U.S. Pat. No. to A. Furrer 4,560,944 also discloses a pulse step modulator similar to that as described above. This patent, however, employs a monitor for monitoring the operation of the various unit step modules for purposes of controlling the modulator. Specifically, the circuit disclosed serves to provide a first on-first off operation of the various modules. Thus, as the input signal increases in magnitude, the module that has been turned off for the longest will be the first to be turned on. Conversely, as the input signal decreases in magnitude, the module that has been turned on the longest will be the first to be turned off.

The prior art noted above has not addressed the issue of whether one or more of the modules has failed either by being failed in a "on" condition or in a "off" condition. A problem can occur when one or more of the modules has failed. In the event of the failure of a step module, that module is no longer controlled and assumes a state of being continuously on or off. Consequently, during operation involving a switching sequence including the failed module, the sequence anticipates that the failed module will operate properly to turn on or to turn off. Since the module has failed, an improper module voltage will result in a distortion of the system output voltage.

SUMMARY OF THE INVENTION

It is an object of the present invention to provide an improved pulse step modulator having faulted module detection and compensation therefore to prevent distortion in the output voltage in the event of one or more failed modules.

In accordance with the invention, a modulator is provided including a plurality of modules each including a DC voltage source, and an associated actuatable switch which, when actuated, turns on the associated module to provide a signal, such as a step voltage. An output circuit is connected to the modules for providing an output signal to a load wherein the magnitude of the output signal is equal to the sum of all of the signal sources of the modules that are turned on. A plurality of turn on signals are provided with each serving to actuate one of the switches in one of the modules so that the number of turn on signals is dependent upon the magnitude of an input signal. A fault detector monitors the operation of each module for fault conditions and provides for each module a first signal representative that the module has faulted in an on condition or a second signal representative that the module has faulted in an off condition. The number of turn on signals is varied dependent upon the fault conditions detected by the fault detector in order to compensate for any faulted modules.

BRIEF DESCRIPTION OF THE DRAWINGS

The foregoing and other objects and advantages of the invention will become more readily apparent from the following description as taken in conjunction with the accompanying drawings, wherein.

DESCRIPTION OF THE PREFERRED EMBODIMENT

Figure 1:
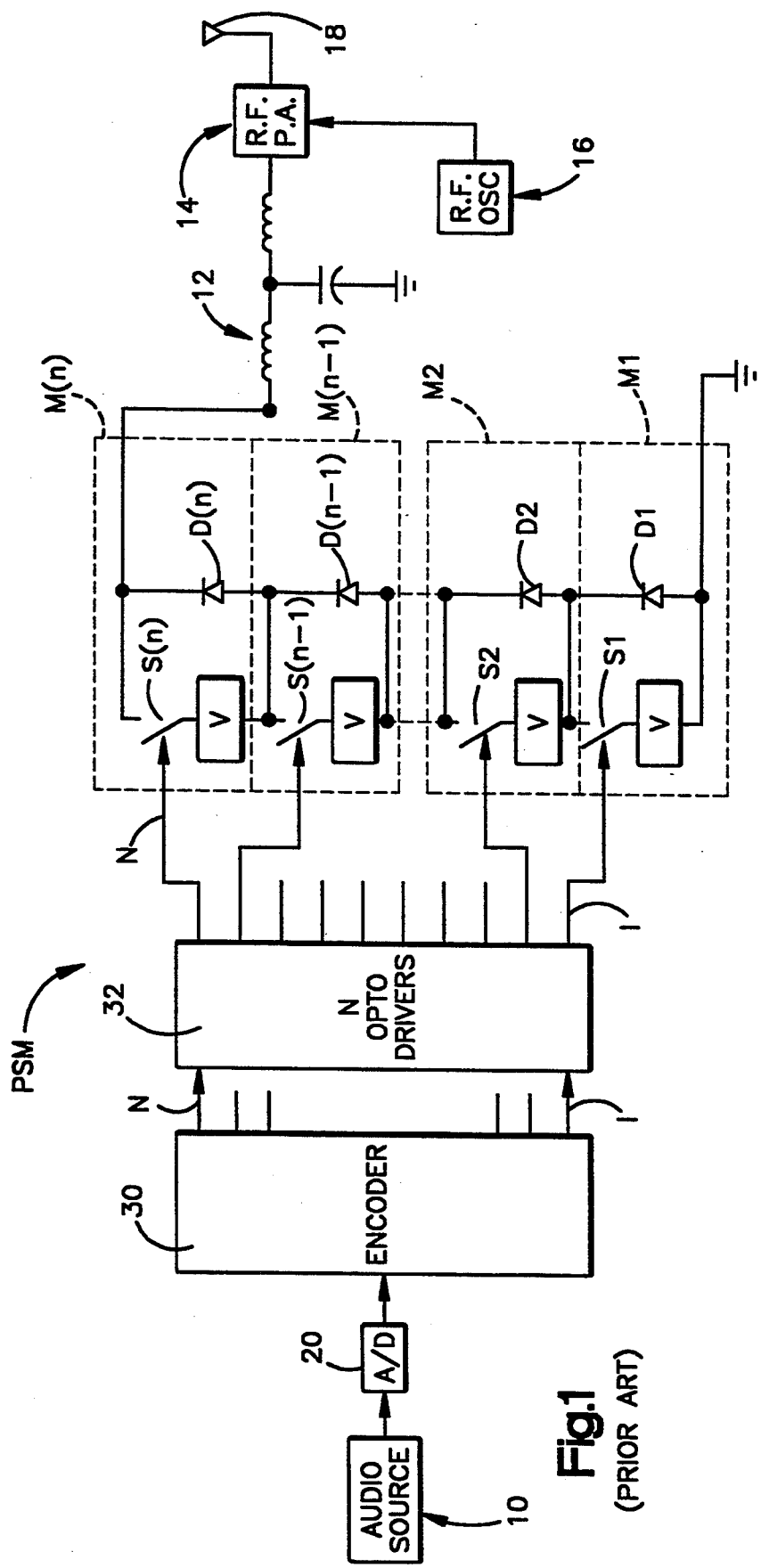
FIG. 1 is a schematic-block diagram illustration of a prior art AM broadcasting transmitter employing a pulse step modulator (PSM)

Reference is now made to the drawings wherein the showings are for purposes of illustrating a preferred embodiment of the invention only and not for purposes of limiting same. FIG. 1 illustrates an AM transmitter which incorporates a pulse step modulator (PSM). The transmitter includes an audio source 10 which generates an amplitude and frequency varying audio signal which is to be amplified and transmitted. This signal is supplied by way of a conventional analog-to-digital converter 20 to a pulse step modulator (PSM). The pulse step modulator, to be described in greater detail hereinafter, amplifies the signal to a high power level and provides a resulting amplitude signal $V_{out}$ to a low pass filter 12. The resulting amplified and filtered signal is then supplied to the audio input of a conventional RF power amplifier 14 where it amplitude modulates an RF carrier signal supplied by an RF oscillator 16. The resulting AM signal is then transmitted by a conventional antenna 18.

The analog-to-digital converter 20 receives the analog audio signal from the audio source 10 and converts it into a multi-bit digital representation thereof. For example, the analog input signal may be converted into a 12 bit digital signal. The six most significant bits (6MSB) are supplied to a decoder 30 having N output circuits which are supplied to an optical driver circuit 32. Circuit 32 has N output circuits respectively connected to N unit step switches S1 through SN. Switches S1 through SN are respectively located in unit step modules M1 through M(N).

The encoder 30 sequentially energizes its output circuits 1 through N with incremental increases in the magnitude of the analog signal and de-energizes the output circuits in the reverse order with incremental decreases in the magnitude of the analog signal. These are reflected through the optical driver circuit 32. The optical driver circuit has output circuits 1 through N which serve to sequentially close switches S1 through SN as the analog input signal incrementally increases in magnitude and to sequentially open the switches, in the reverse order, as the input analog signal incrementally decreases in magnitude. Whenever a switch S1 through SN is open, the associated unit step module is turned off and whenever a switch is closed, the associated unit step module is turned Each unit step module M1 through M(N) includes an incremental unit step voltage source V, a switch such as switch S1 and a diode such as diode D1 all interconnected as shown with respect to module M1 in FIG. 1. The unit step modules are connected together in series with diodes D1 through D(N). Each incremental voltage source may be considered as a DC voltage source of a fixed magnitude which, in practice, may be on the order of 600 volts. The total voltage across the series connected modules is dependent upon the number of modules which have been turned on by closure of the associated switches S1 through S(N). For example, if all of the switches S1 through SN are closed, then all of the unit step voltage sources V are connected together in series and added together to provide an output voltage NV. If each unit step voltage source V has a value on the order of 600 volts and N is on the order of 50, then the total voltage may be on the order of 30,000 volts.

Figure 2A:
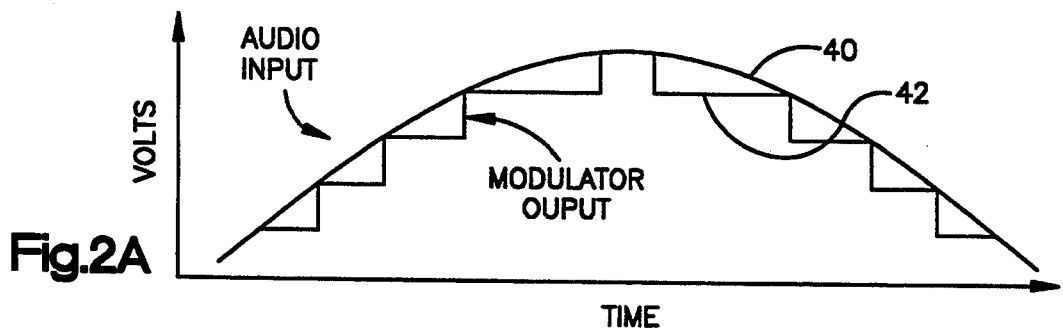
FIG. 2 includes FIGS. 2A and 2B which are graphical waveforms of voltage with respect to time useful in explaining the background of the invention.
Figure 2B:
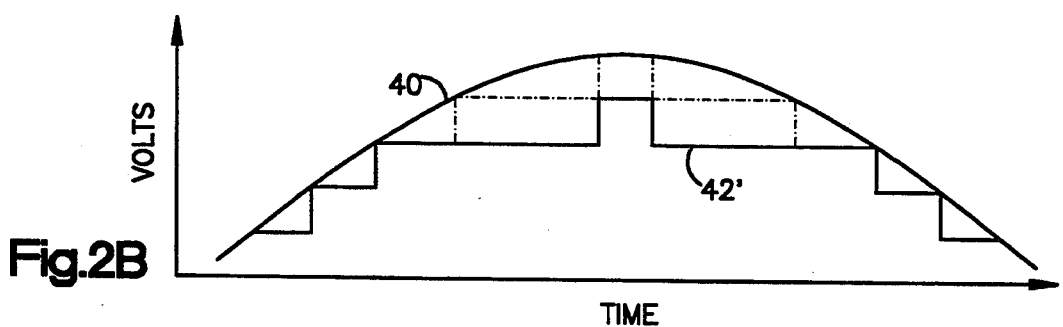

The switches associated with the unit step modules must be capable of handling such a voltage and the ensuing current. Consequently, these switches, in practice, take the form of IGBT or GTO transistor switches. If a switch fails, distortion will result in the output voltage. Reference is now made to FIG. 2A which illustrates an audio input voltage 40 which represents an input signal obtained from an audio source 10 and wherein the input signal is an amplitude and frequency varying signal which is to be amplified and transmitted. Superimposed on the input signal 40 there is illustrated an output modulator voltage 42 which is a step voltage and which increases and decreases in incremental step voltages with increasing and decreasing values of the input signal 40. For purposes of simplification, no amplification is illustrated in these waveforms. FIG. 2B is similar to that of FIG. 2A but shows the modulator output voltage 42' as it results when one of the unit step modules has failed in an off condition. This results in a distorted output waveform and will remain distorted even after being passed by the filter 12.

The present invention is directed toward a pulse step modulator (PSM) system that incorporates circuitry to eliminate the distortion that would otherwise exist in the presence of a failed module. Thus, if the step amplifier module residing at a given location in the system has failed in its off condition, the encoder will be reprogrammed so as to skip the affected module in the encoding sequence during modulation. The effect of the presence of the failed "off" module is that the positive extreme of the voltage range is reduced by the voltage of the failed module. In either case of a module failed "on" or "off", the presence of a failed module does not result in a distorted output signal. Instead, the dynamic range of this system is reduced.

Figure 4:
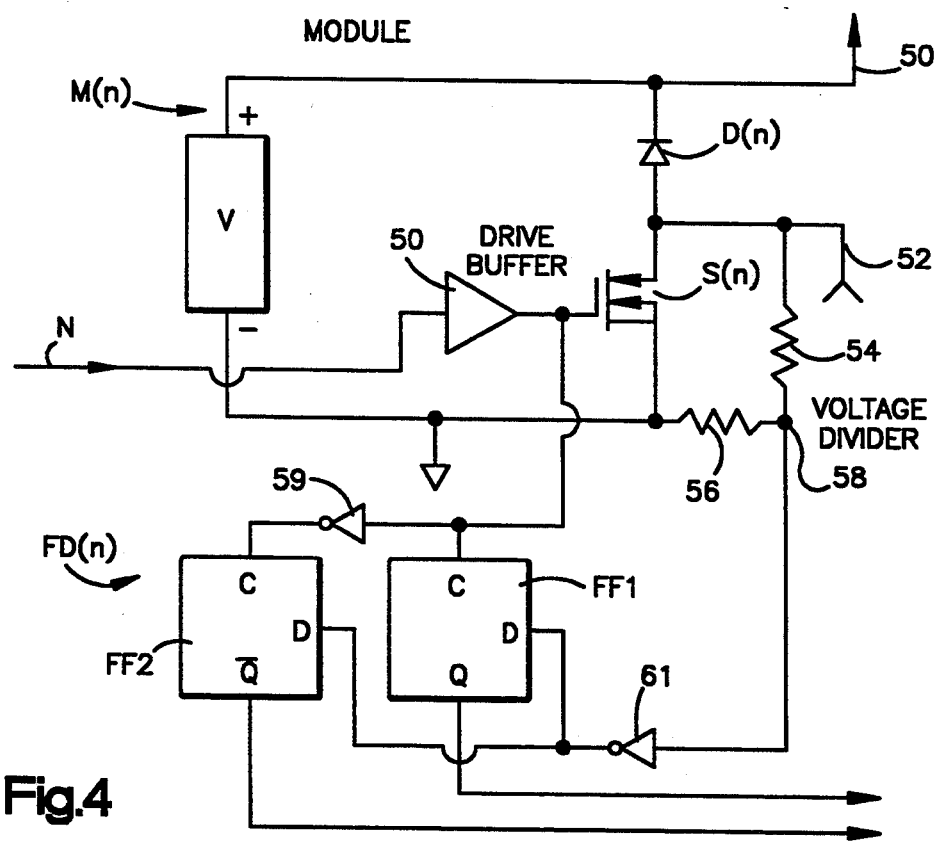
FIG. 4 is a schematic-block diagram illustration of a portion of the circuitry incorporated in the embodiment of FIG. 3.
Figure 3:
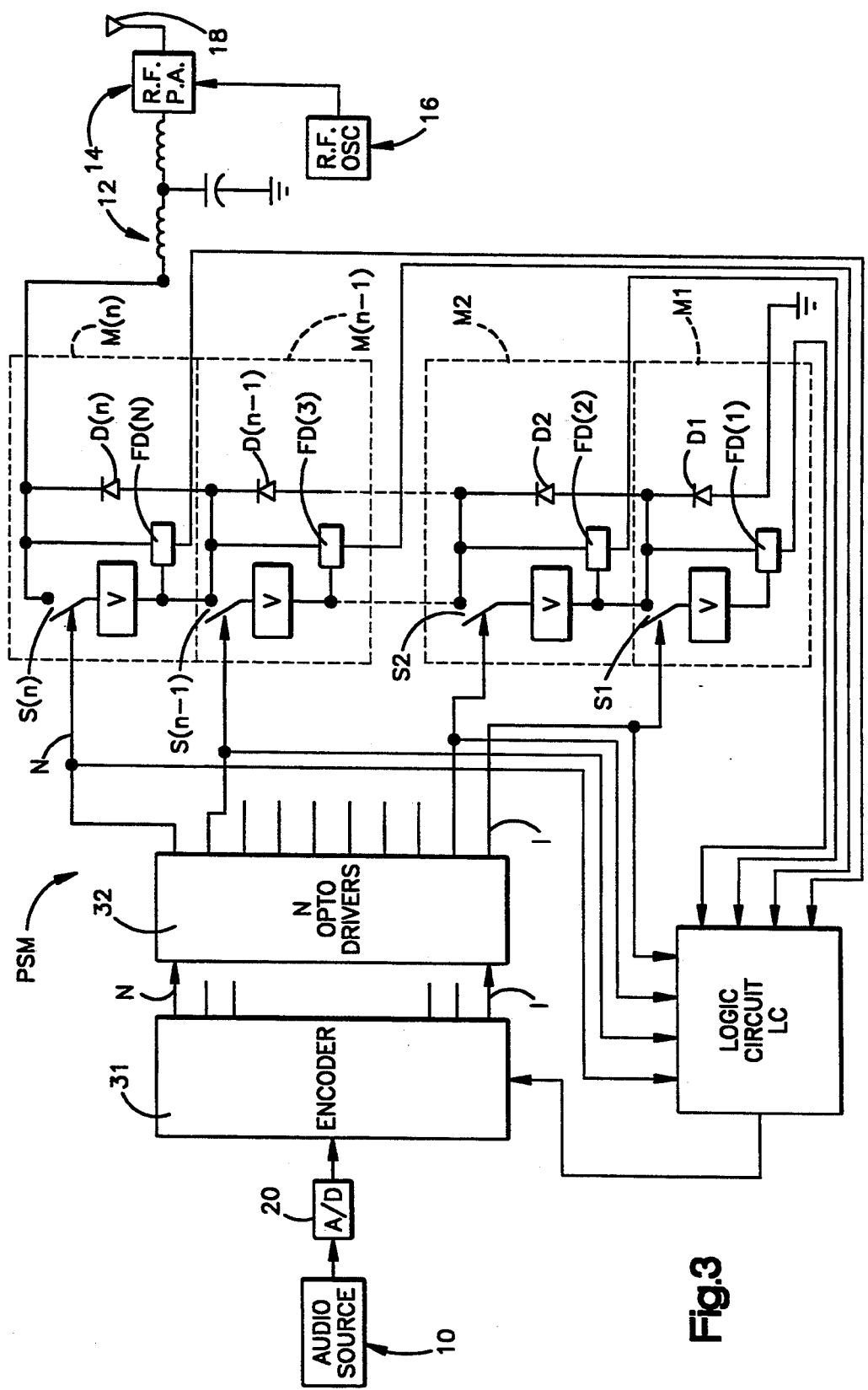
FIG. 3 is a schematic-block diagram illustration of a pulse step modulator incorporating the present invention.
Figure 5:
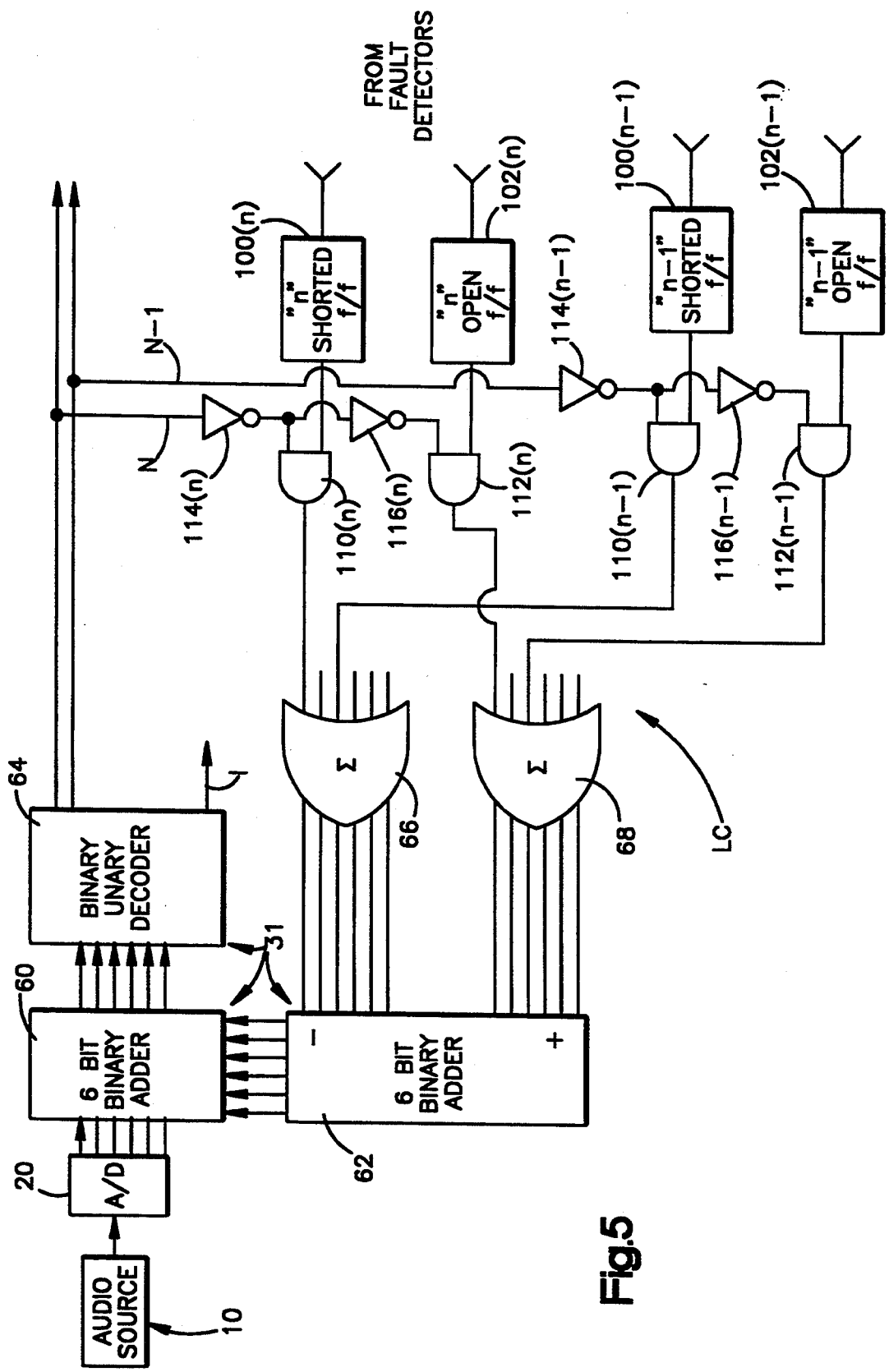
FIG. 5 is a schematic-block diagram illustration of a portion of the circuitry employed in FIG. 3.

Circuitry to accomplish the foregoing in accordance with the present invention is illustrated in FIGS. 3, 4 and 5. FIG. 3 discloses a pulse step modulator system similar to that as illustrated in FIG. 1 and like components are identified in both figures with the same character references. Only the differences between the two circuits will be described in detail herein below. In this pulse step modulator, circuitry is provided for detecting a failed module among modules M1 through M(N) and the location of the failed module and whether the module has failed in an on condition or in an off condition. After the fault has been detected, the encoder operates to compensate for the failed module or modules.

In accordance with the present invention, FIG. 3 employs fault detecting means associated with each of the modules M1 through M(N) for detecting faults at the various modules. Thereafter, an encoder 31 which operates as an adaptive encoder and which differs from the encoder 30 is operated upon to compensate for the failed module or modules.

Each fault detector takes the form of the fault detector FD(N) as shown in FIG. 4. This fault detector is connected to the unit step module M(N). The switch S(N) is illustrated in FIG. 4 as being a semiconductor switch such as an IGBT transistor switch and which receives its control input from a control line N taken from the opto drivers 32 by way of a drive buffer 50. Whenever the drive buffer output line N carries a turn on signal, it appears as a positive or binary 1 signal. This is supplied through the drive buffer to turn the transistor switch S(N) on. When the transistor switch is turned on, the unit step voltage V appears across the output terminals 50 and 52 which extend across opposite ends of the diode D(N). The operation of the transistor switch is sensed by a voltage divider including resistor portions 54 and 56 having a junction point 58. The voltage at this junction point is essentially zero when the switch is off and it is a positive signal or a binary "1" level when the switch is turned on. The condition of the switch is supplied to the fault detector FD(N) as described below.

The input to the switch S tells the switch whether to be on or off and the status of the switch is noted by observing the voltage at the junction point 58 of the voltage divider. Consequently, the output of the drive buffer is supplied to the clock input of a flip-flop FF-1 and by way of an inverter 59 is supplied to the clock input C of a flip-flop FF-2. The status of the switch as taken from the Junction 58 of the voltage divider is supplied by way of an inverter 61 to the data inputs D of flip-flops FF-1 and FF-2. The flip-flops make the comparison between the input drive signal and the status of the transistor switch and provides outputs taken from the Q output of flip-flop FF-1 and the Q output of flip-flop FF-2. When the Q output of flip-flop FF-1 provides a binary 1 signal, this indicates that the transistor switch S(N) is shorted or stuck on. When the Q output of flip-flop FF-2 is a binary "1" signal, this is representative that the transistor switch is open or is stuck off.

Reference is now made to FIG. 5 which shows an adaptive encoder 31 which is connected to the fault detectors by way of a logic circuit LC. The fault detectors include fault detectors FD1 through FD(N) respectively associated with unit step modules M(1) through M(N).

The adaptive encoder 31 as illustrated in FIG. 5 includes a pair of six bit binary adders 60 and 62, a binary-unary decoder 64 and a logic circuit LC interconnected with the fault detectors. This logic circuit LC includes summing circuits 66 and 68, each of which provides a six bit binary output to the binary adder 62. The output from summer 66 is directed to the negative or subtracting input of adder 62, whereas the output from summer 68 is supplied to the positive or adding input of adder 62.

Each of the summers 66 and 68 has N inputs. Each input is connected in the manner as discussed hereinbelow with reference to FIGS. 4 and 5. A pair of flip-flops 100(N) and 102(N) in FIG. 5 are associated with the N fault detector FD(N) of FIG. 4. Thus, the Q output of flip-flop FF-1 of fault detector FD(N) is connected to the input of the N shorted flip-flop 100(N) in FIG. 5, whereas the Q output of flip-flop FF-2 is connected to the input of the N open flip-flop 102(N) in FIG. 5. Similarly, an N-1 shorted flip-flop 100 (N-1) and an N-1 open flip-flop 102 (N-1) are connected to the outputs of the Q and Q terminals of a pair of flip-flops located in fault detector FD (N-1) (not shown). Similar connections are made to all of the fault detectors FD(1) through FD(N-2).

In the circuitry shown in FIG. 5, the output of flips-flops 100(N) and 102(N) are supplied to AND gates 110(N) and 112(N), respectively. The second input to each of these gates is taken from the N output line from the decoder 64. The second input to the AND gate 110(N) is taken from output circuit N by way of an inverter 114(N). A second inverter 116(N) connects the junction of inverter 114(N) and AND gate 110(N) the second input of AND gate 112(N). Similar connections are made to AND gates 110(N-1) and 112(N-1) associated with flip-flops 100(N-1) and 102(N1).

Before presenting a detailed description of the operation of the circuitry presented in FIGS. 4 and 5, a generalized description is presented to assist in the understanding of the operation. Thereafter, a detailed description of operation will be presented relative to FIGS. 4 and 5.

The fault detector circuit, which includes fault detectors FD-1 through FD-N, serves to detect the presence of a failed module and its location and whether the module has failed "on" or "off". A detector is associated with each of the unit step modules and the detector takes the form of the fault detector illustrated in FIG. 4. This detector provides status information as to whether the associated module has faulted "on" or has faulted "off".

The adaptive encoder, more specifically discussed hereinafter with reference to FIG. 5, operates as a conventional binary-to-unary converter with some exceptions to be discussed below. Thus, for example, if the binary word A as taken from the output of the analog-to-digital converter 20 is representative of the decimal number 16, then a logic "1" signal will be provided at outputs 1 through 16 of the binary-unary decoder 64. These will serve as "turn on" signals to turn on modules M1 through M16. If one of these modules has failed, then the programming of the encoder must be changed. That is the purpose of the circuitry to be described in greater detail hereinafter with reference to FIG. 5. For example, if the unit step module in position "B" is detected as having failed in its "off" position, all binary words less than "B" are converted normally. However, if a binary word "A" is to be converted, where "A" is greater than or equal to "B", then the encoder will output a logic "1" to each of its output circuits driving step modules 1 through (A+1) to compensate for the faulted module at location "B".

In the situation where a unit step module has been detected as having failed "on", a somewhat different operation takes place. Thus, if a unit step module in position "B" has been detected as having failed in its "on" position, those binary words provided by the analog-to-digital converter 20 having a value greater than or equal to "B" are converted in the normal manner. However, if a binary word "A" is to be converted where "A" is less than "B", the encoder must output a logic "1" to those output circuits driving unit step modules in positions 1 through (A-1).

Attention is now directed to a more specific description of the operation of the embodiment disclosed herein with particular emphasis relative to FIGS. 4 and 5. Assume the failed module is pulse step module M10. Thus "B" equals 10. Also, assume that the total number of modules is substantially greater than 10 and, for example, may be 64 modules. In the discussion that follows, examination is first had of the operation that takes place if module M10 has failed "off" and then a discussion is presented if the operation takes place when the module has failed "on". As discussed hereinbefore, if a module fails off, all binary words less than the number of the failed module, i.e., ten, will be converted in a normal fashion, whereas all binary words (A) that have a value equal to or greater than 10 will have their values increased by one. That is, for all binary numbers provided by the analog-to-digital converter 20 less than 10, no change will be made. However, for all binary numbers from the analog-to-digital converter 20 that are equal to 10 or greater, the number will be increased by one so that one additional output circuit from decoder 64 is energized or turned on so that the proper number of pulse step modules are activated.

In this example, the failed module M10 has been detected by its associated fault detector circuit FD10 as having failed off. Consequently, the Q output of flip-flop FF-1 of the fault detector FD10 is at a binary "0" level, whereas the Q output of flip-flop FF-2 is at a "1" level. This binary "1" signal is supplied to the adaptive encoder (see FIG. 5) and, more specifically, to the associated flip-flop 102(10). This supplies a binary 1 signal to the associated AND gate 112(10). For all outputs from the analog-to-digital converter 20 having a value of 10 or greater, one additional count is added to the number to compensate for the failed module. Nothing is changed if the value of the output of the analog-to-digital converter is less than 10. Thus, fault detectors FD1 through FD9 do not detect any faults and, consequently, the associated flip-flops 100 and 102 in the adaptive encoder (FIG. 5) are not set and, hence, no changes are supplied by summing circuits 66 and 68 to the binary adder 62. However, when the output of the analog-to-digital converter 20 is at a decimal value of 10, fault detector FD10 recognizes a fault at module M10 and that the module has faulted in an off condition. This causes the associated flip-flop 102(10) to be set so as to supply a binary 1 to its associated AND gate 112(10). Consequently, for a count of 10 or greater, output line 10 of the decoder 64 will be turned on to supply a binary 1 signal through inverters 114(10) and 116(10) to the AND gates 110(10) and 112(10). Since only AND gate 112(10) was enabled by flip-flop 102(10), this AND gate now supplies a one signal to the summing circuit 68. The summing circuit 68 has a six bit output and it supplies a binary signal to the six bit adder 62 indicating that one should be added to the count provided by the output circuit of the analog-to-digital converter 20. Accordingly, the output from the binary adder 62 is added to the output of the converter 20 at adder 60 and the result is supplied to the binary-unary decoder 64. This increases the number of output circuits carrying a binary 1 or turn on signal by one additional circuit so that there are now 11 circuits that carry a binary 1 or turn on signal. This compensates for the failure in an off condition at module M10. All additional counts above 10 will also have an additional output circuit from decoder 64 energized to compensate for the fault in an off condition at module M10. If there are additional faults at modules M11 through M64 and which faults are also in an off condition, then an additional count will be added for each such faulted module to provide the appropriate compensation.

Attention is now directed to the operation that takes place when one of the modules has failed on. Again, assume that the failed module is module M10. Also, assume that the failure is that the module is stuck "on". In such case, the fault detector FD10 recognizes that module M10 has failed and that the failure is that the module is stuck on. Consequently, fault detector FD10 provides a "1" signal on its output taken from the Q terminal of flip-flop FF-1. This is supplied to its associated flip-flop 100(10) in FIG. 5. This sets that flip-flop resulting in a binary 1 signal being supplied to one input of AND gate 110(10). Consequently, whenever the output of the analog-to-digital converter 20 is at a value of 10 or greater, no change is made to the count. Thus, at a count of 10 or more, no change is supplied to summation circuit 66 or 68. However, when the count is less than 10, for each module that is faulted on, a subtraction of 1 must be made to compensate for the faulted module or modules. Thus, at a count of eight, module M10 is still stuck on and, even though the tenth output of decoder 64 is turned off, the inverter 114(10) for that module will provide a binary 1 signal to AND gate 110(10) which has been enabled by the associated flip-flop 100(10). This supplies a one signal to the summation circuit 66 which, in turn, provides an output indicating that one should be subtracted at adder 62 from whatever the count is that's taken from the analog-to-digital converter 20. In the case under examination, the output of converter 20 is calling for a count of eight, which means that eight of the output circuits from decoder 64 should be turned on. Since one of the modules at a higher location, i.e., at location 10 is already turned on, then, in order to have eight modules turned on, only output lines 1 through 7 should carry a turn on signal. This is accomplished by the circuitry discussed above.

Whereas the invention has been described in conjunction with a particular embodiment, it is to be appreciated that various modifications will occur to those skilled in the art within the spirit and scope of the invention as defined by the appended claims.

Having described the invention, the following is claimed:

1. A pulse step modulator comprising:
   a plurality of series connected unit step modules, each including a DC voltage source and an associated actuatable switching means for, when actuated, turning on said associated module to provide a unit step voltage;
   an output circuit connected to said series connected modules for providing an output voltage to a load wherein the magnitude of the output voltage is equal to the sum of all of the voltage sources of the modules that are turned on;
   means for providing a plurality of module turn on signals, each for actuating a said switching means in one of said modules, such that the number of turn on signals is dependent upon the magnitude of an input signal;
   fault detector means for monitoring the operation of each said module for fault conditions and providing for each said module a first signal representative that the module has faulted in an on condition or a second signal representative that the module has faulted in an off condition; and
   means for varying the number of said turn on signals dependent upon the fault conditions detected by said fault detector means to compensate for any faulted modules.

2. A pulse step modulator as set forth in claim 1 wherein said fault detector means includes a plurality of fault detector circuit means each connected to one of said unit step modules and each said circuit means having a first circuit including means for providing a said first signal and a second circuit having means for providing a said second signal.

3. A pulse step modulator as set forth in claim 2 wherein said first circuit includes a bistable means for providing said first signal.

4. A pulse step modulator as set forth in claim 2 wherein said second circuit includes bistable means for providing a said second signal.

5. A pulse step modulator as set forth in claim 2 including first circuit means including first bistable means for providing said first signal and wherein said second circuit includes second bistable means for providing said second signal.

6. A pulse step modulator as set forth in claim 1 wherein said turn on signal varying means includes means for decreasing the number of said turn on signals when said fault detector means provides a said first signal.

7. A pulse step modulator as set forth in claim 1 wherein said turn on signal varying means includes means for increasing the number of said turn on signals when said fault detector means provides a said second signal.

8. A pulse step modulator as set forth in claim 1 wherein said fault detector means includes a plurality of fault detector circuit means each connected to one of said modules and each having a first circuit for providing a said first signal and a second circuit for providing a said second signal, and said turn on signal varying means includes means for decreasing the number of said turn on signals when said first signal provides a said first signal.

9. A pulse step modulator as set forth in claim 8 wherein said turn on signal varying means includes means for increasing the number of said turn on signals when said second circuit provides a said second signal.

10. A pulse step modulator as set forth in claim 9 wherein said first circuit includes first bistable means for providing said first signal and wherein said second circuit includes second bistable means for providing said second signal.

11. A modulator comprising:
a plurality of unit modules, each including a signal source and an associated actuatable switching means for, when actuated, turning on said associated module to provide a unit signal;
an output circuit connected to said modules for providing an output signal to a load wherein the magnitude of the output signal is equal to the sum of all of the signal sources of the modules that are turned on;
means for providing a plurality of module turn on signals, each for actuating a said switching means in one of said modules, such that the number of turn on signals is dependent upon the magnitude of an input signal;
fault detector means for monitoring the operation of each said module for fault conditions and providing for each said module a first signal representative that the module has faulted in an on condition or a second signal representative that the module has faulted in an off condition; and
means for varying the number of said turn on signals dependent upon the fault conditions detected by said fault detector means to compensate for any faulted modules.

12. A modulator as set forth in claim 11 wherein said fault detector means includes a plurality of fault detector circuit means each connected to one of said unit modules and each said circuit means having a first circuit including means for providing a said first signal and a second circuit having means for providing a said second signal.

13. A modulator as set forth in claim 12 wherein said first circuit includes a bistable means for providing said first signal.

14. A modulator as set forth in claim 12 wherein said second circuit includes bistable means for providing a said second signal.

15. A modulator as set forth in claim 12 including first circuit means including first bistable means for providing said first signal and wherein said second circuit includes second bistable means for providing said second signal.

16. A modulator as set forth in claim 11 wherein said turn on signal varying means includes means for decreasing the number of said turn on signals when said fault detector means provides a said first signal.

17. A modulator as set forth in claim 11 wherein said turn on signal varying means includes means for increasing the number of said turn on signals when said fault detector means provides a said second signal.

18. A modulator as set forth in claim 11 wherein said fault detector means includes a plurality of fault detector circuit means each connected to one of said modules and each having a first circuit for providing a said first signal and a second circuit for providing a said second signal, and said turn on signal varying means includes means for decreasing the number of said turn on signals when said first signal provides a said first signal.

19. A modulator as set forth in claim 18 wherein said turn on signal varying means includes means for increasing the number of said turn on signals when said second circuit provides a said second signal.

20. A modulator as set forth in claim 19 wherein said first circuit includes first bistable means for providing said first signal and wherein said second circuit includes second bistable means for providing said second signal.

* * * * *